(12) United States Patent
Nagata

(10) Patent No.: US 7,384,873 B2
(45) Date of Patent: Jun. 10, 2008

(54) MANUFACTURING PROCESS OF SEMICONDUCTOR DEVICE

(75) Inventor: Kazunari Nagata, Shirako (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 11/402,589

(22) Filed: Apr. 12, 2006

(65) Prior Publication Data

US 2006/0240589 A1 Oct. 26, 2006

(30) Foreign Application Priority Data

Apr. 25, 2005 (JP) ............................. 2005-126572

(51) Int. Cl.
*H01L 21/302* (2006.01)
(52) U.S. Cl. .................... 438/695; 438/708; 438/720; 438/725; 438/729; 438/742
(58) Field of Classification Search ................ 438/695, 438/708, 720, 725, 729, 742
See application file for complete search history.

(56) References Cited

U.S. PATENT DOCUMENTS

| 5,538,920 | A | | 7/1996 | Wakabayashi | |
| 5,949,133 | A | * | 9/1999 | Wojnarowski | ............... 257/668 |
| 6,200,888 | B1 | | 3/2001 | Ito et al. | |
| 2002/0182837 | A1 | * | 12/2002 | Daubenspeck et al. | ..... 438/601 |

FOREIGN PATENT DOCUMENTS

| JP | 01100946 A | * | 4/1989 | ................. 438/763 |
| JP | 02-207552 | * | 8/1990 | |
| JP | 2001-144223 | | 5/2001 | |
| JP | 2004-039863 A | | 2/2004 | |
| JP | 2005-197383 | | 7/2005 | |

* cited by examiner

*Primary Examiner*—Binh X. Tran
(74) *Attorney, Agent, or Firm*—Harness, Dickey & Pierce, P.L.C.

(57) ABSTRACT

A method of manufacturing a semiconductor device, includes: forming a resin layer with a resin containing an aromatic compound on a surface, where an electrode is formed, of a semiconductor substrate, by avoiding at least part of the electrode; removing an oxide film from a surface of the electrode using Ar gas and carbonizing the surface of the resin layer to form a carbonized layer; forming wiring from the electrode to over the carbonized layer; and etching, after forming the wiring, the carbonized layer by $O_2$ plasma using the wiring as a mask so as to remove the carbonized layer partially.

7 Claims, 4 Drawing Sheets

(A)

(B)

(C)

MANUFACTURING PROCESS OF SEMICONDUCTOR DEVICE

The entire disclosure of Japanese Patent Application No. 2005-126572, filed Apr. 25, 2005 is expressly incorporated by reference herein.

BACKGROUND OF THE INVENTION

1. Technical Field

The invention relates to an manufacturing process of a semiconductor device.

2. Related Art

Semiconductor devices to which a chip scale/size package (CSP) is applied have been developed and made available. Especially, a wafer level CSP has been drawing attention of late. In the wafer level CSP, a re-wiring layer is formed on a resin layer, packing is carried out on the wafer level, and, thereafter, a wafer is sliced for each package. At that time, Ar reverse sputtering is normally used to remove an oxide film and the like from a pad surface of a chip.

Japanese Unexamined Patent Publication No. 2001-144223 is an example of related art.

However, the surface layer of a resin layer composed of a resin including an aromatic compound is carbonized by this Ar reverse sputtering, while for manufacturing a semiconductor device of high reliability, it is desirable to remove a carbonized layer between one wiring and another on the resin layer. Further, if a process of removing the carbonized layer can be carried out in a short period of time, a semiconductor device of high reliability can be efficiently manufactured.

SUMMARY

An advantage of some aspects of the invention is to provide a process of manufacturing efficiently a semiconductor substrate of high reliability.

According to a first aspect of the invention, a manufacturing process of a semiconductor device according to the invention includes: forming a resin layer with a resin containing an aromatic compound on a surface, where an electrode is formed, of a semiconductor substrate, by avoiding at least part of the electrode; removing an oxide film from a surface of the electrode using Ar gas and carbonizing the surface of the resin layer to form a carbonized layer; forming wiring from the electrode pad to over the carbonized layer; and etching, thereafter, the carbonized layer by $O_2$ plasma using the wiring as a mask so as to remove the carbonized layer partially.

According to the invention, $O_2$ plasma is applied using the wiring as the mask, whereby the carbonized layer is removed, thus decreasing effect of leakage even if a narrow pitch structure should govern between one wiring and another and making it possible to manufacture efficiently a semiconductor device of high reliability.

BRIEF DESCRIPTION OF THE DRAWINGS

The invention will be described with reference to the accompanying drawings, wherein like numbers refer to like elements.

DESCRIPTION OF THE EMBODIMENT

An embodiment of the invention will be described as follows with reference to the drawings.

Figure 1:
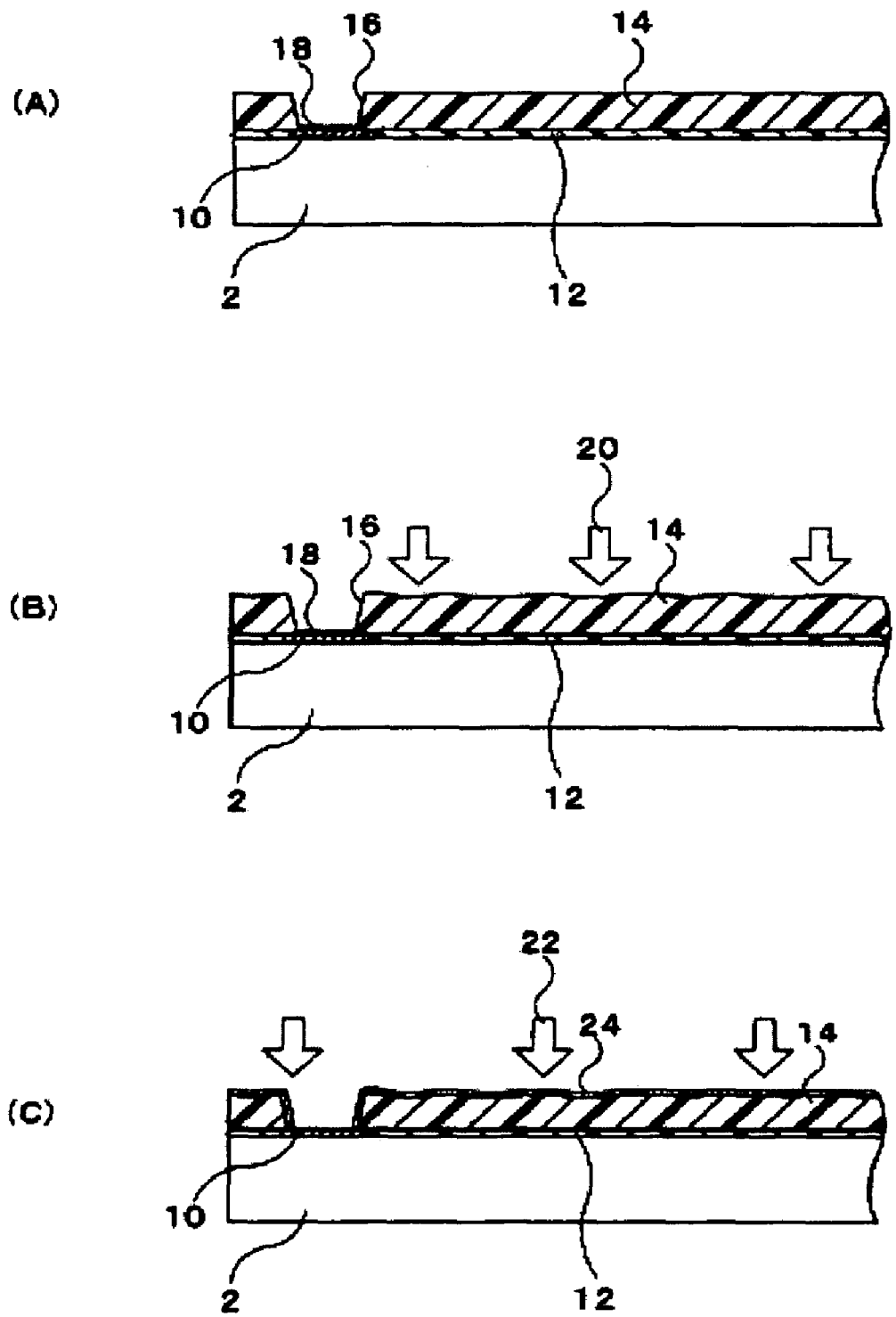
FIGS. 1A, 1B and 1C are diagrams explaining a manufacturing process of a semiconductor device according to an embodiment of the invention.
Figure 2:
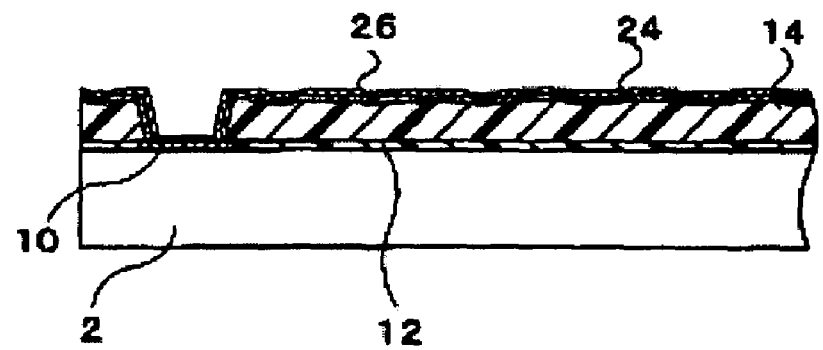
FIGS. 2A, 2B and 2C are diagrams explaining a manufacturing process of a semiconductor device according to an embodiment of the invention.
Figure 2:
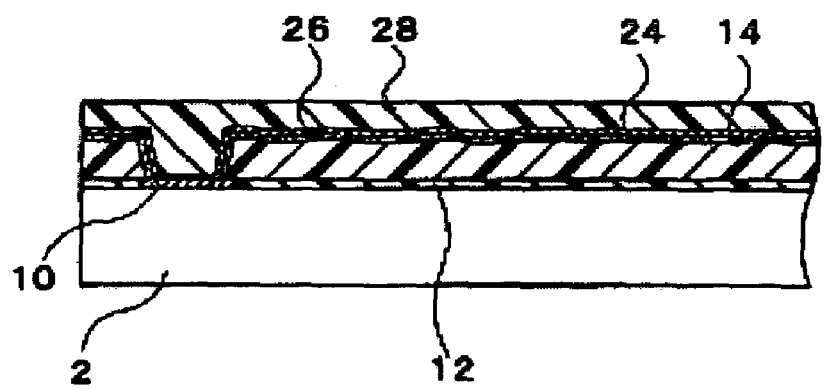
Figure 2:
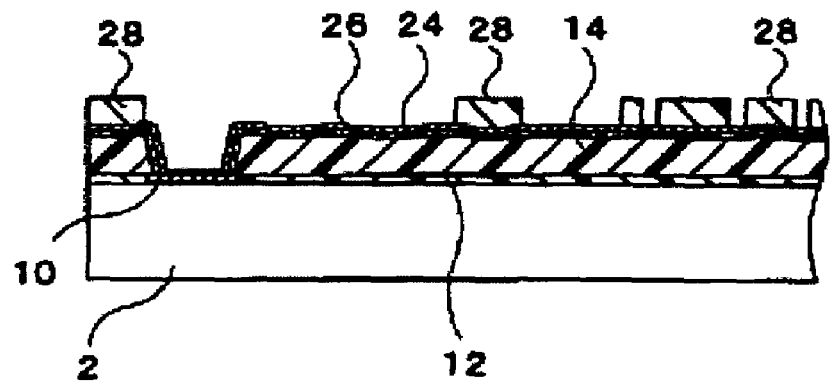
Figure 3:
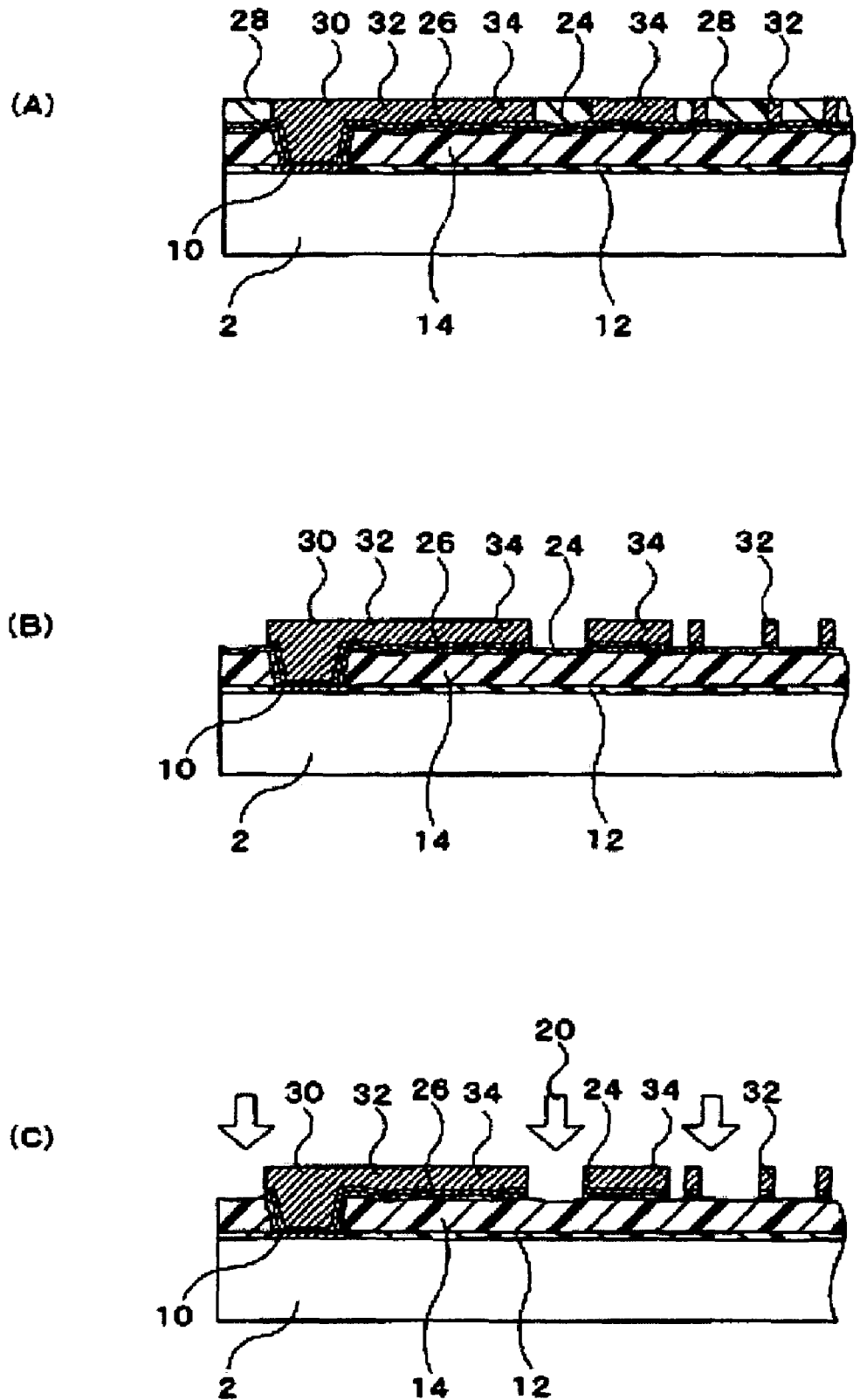
FIGS. 3A, 3B and 3C are diagram explaining a manufacturing process of a semiconductor device according to an embodiment of the invention.
Figure 4:
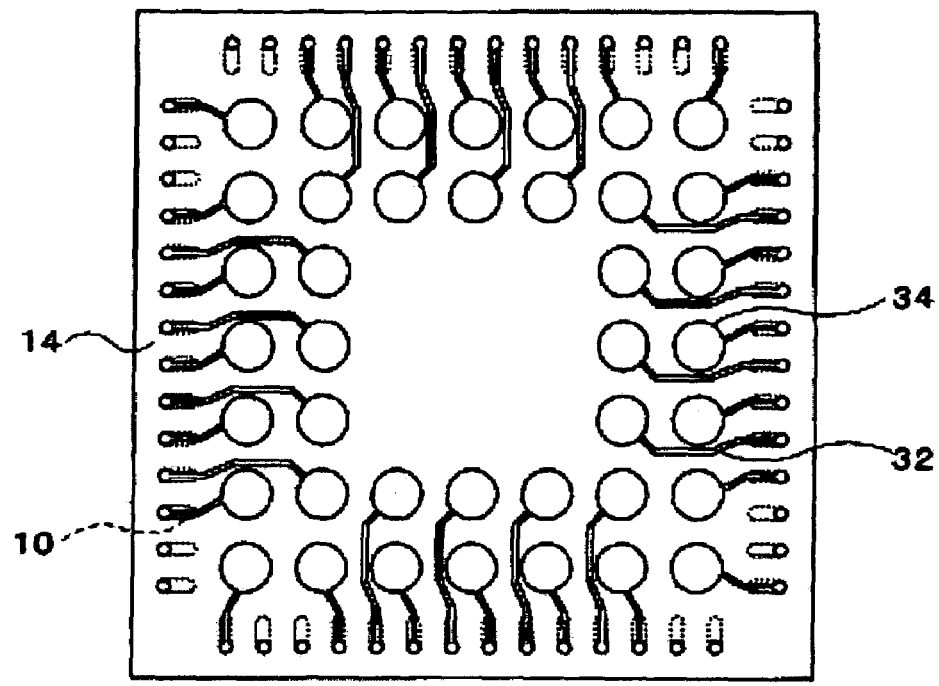
FIG. 4 is a plan view showing a semiconductor device according to an embodiment of the invention.

FIGS. 1A to FIG. 3C are sectional views explaining manufacturing process of a semiconductor device according to an embodiment to which the invention has been applied. FIG. 4 is a plan view showing a semiconductor device according to the embodiment.

According to the embodiment of the invention, as shown in FIG. 1A, a semiconductor substrate 2 is prepared. An integrated circuit element (not illustrated) is formed on the semiconductor substrate 2. On the semiconductor substrate 2, there are formed a plurality of electrodes (for example, a pad) 10 electrically connected to the semiconductor circuit element.

Further, the electrodes 10 may be gold-plated. The electrodes 10 are, for example, formed of A1. The semiconductor substrate 3 has a passivation layer 12. To protect the integrated circuit element, the passivation layer 12 is formed of, for example, a silicon nitride film, a silicon oxide film, a film on which these are layered, or the like, and may cover an upper surface of the semiconductor substrate 2 excluding the electrodes 10.

First, as shown in FIG. 1A, a resin layer 14 is formed of a resin containing an aromatic compound on a surface, where the electrodes pad 10 of the semiconductor substrate is formed, avoiding at least part of the electrodes 10. The resin layer 14 is formed on the passivation layer 12. The resin layer 14 may have a stress-relieving function.

An opening 16 which exposes the electrodes 10 is formed. The resin layer 14 can be formed of a resin such as polyimide, polybenzoxysazol, benzocyclobutene or epoxy, which is an aromatic compound of an organic compound having a benzene ring and its condensed ring. The resin 14 is formed by coating a resin material on the semiconductor substrate 2 and removing a portion thereof corresponding to the electrodes 10.

As is well-known in the Technical Field herein, the resin material can be coated on the semiconductor substrate 2 by the spin coat method, and the opening 16 exposing the electrodes 10 by photolighography can be formed. The resin layer 14 is about 2 μm to about 50 μm thick and can be hardened under an environment of approx. 300° C. for about two hours. It should be noted that in this process, oxidation of the surface of the electrodes 10 is promoted under the high-temperature environment and an oxide film 18 is formed thereon.

Next, the surface of the resin layer 14 may be made uneven as shown in FIG. 1B. For example, by subjecting the surface of the resin layer 14 to all-surface ashing (plasma treatment) through $O_2$ plasma 20 and the like, the surface of the resin layer 14 is slightly removed by etching to make the surface of the resin layer 14 uneven. Note that when this process is carried out, the surface of the electrodes 10 is oxidized through active oxygen of the O$_2$ plasma 20 on the surface of the electrodes 10, and the oxide film 18 further grows.

Next, as shown in FIG. 1C, the oxide film 18 is removed from the surface of the electrodes 10 using reverse sputtering of Ar gas 22. There follows carbonizing of the surface of the resin layer 14 through Ar gas and the carbonized layer 24 is formed on the surface of the resin layer 14.

Subsequently, as shown in FIG. 2A, a seed layer 26 is formed on the carbonized layer 24 of the resin layer 14. As widely known, the seed layer 26 can be formed by sputtering, functioning as an adhesion promotion layer, a diffusion prevention layer and a plated layer The seed layer 26 is, for example, can be formed by combining titanium and copper and, as necessary, can be formed in combination with other metals. Note that after a process of performing reverse sputtering of Ar gas 22 until performing a process of forming the seed layer 26, it may be set up such that the semiconductor substrate 2 is not permitted to be in contact with an atmosphere (for example, atmosphere) containing oxygen.

Especially, after the process of performing reverse sputtering of Ar gas 22 until performing the process of forming the seed layer 26, it may be set up such that the electrodes 10 are not permitted to be in contact with an atmosphere (for example, atmosphere) containing oxygen. For example, after the process of performing reverse sputtering of the Ar gas 22 until performing the process of forming the seed layer 26, the semiconductor substrate 2 may be kept or conveyed in vacuum.

Next, as shown in FIG. 2B, a photoresist 28 having photo-sensitivity is formed on the seed layer 26.

Next, as shown in FIG. 2C, the photoresist 28 is subjected to patterning in exposure development processing such that a portion where copper plating is desired to be formed is removed via a mask (not illustrated) of a preset pattern.

Subsequently, as shown in FIG. 3A, an electrolytic copper plating 30 is formed on a portion where the seed layer 26 is exposed. At this time, the seed layer 26 functions as a plating electrode. By this means, wiring 32 from the electrodes 10 to the carbonized layer 24 is formed. Thickness of the wiring 32 formed by plating is approx. 5 μm. The wiring 32 is electrically connected to the electrodes 10. The wiring 32 may cover an entire, exposed surface of the electrodes 10. The wiring 32 has land 34 which is an electrode for external connection.

Next, as shown in FIG. 3B, the photoresist 28 is exfoliated and, further, an exposed portion of wiring 32 of the seed layer 26 is removed.

Thereafter, as shown in FIG. 3C, the carbonized layer 24 is subjected to etching with O$_2$ plasma using the wiring 32 as the mask and removing partially the carbonized layer 24. As shown in FIG. 4, this enables a semiconductor device to be produced without the carbonized layer 24 at a spot not overlapping the wiring 32 of the surface of the resin layer 14.

Figure 5:
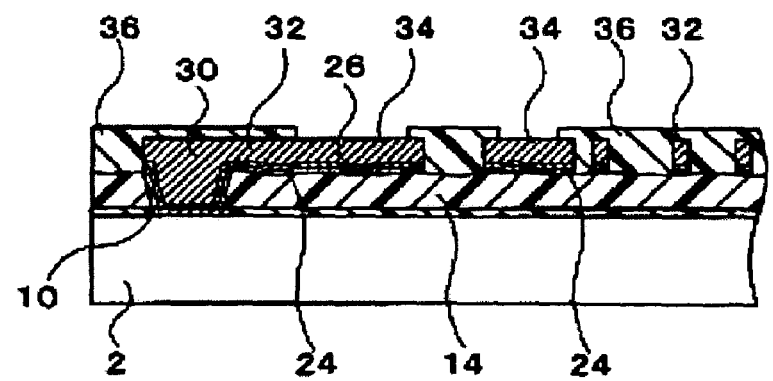
FIG. 5 is a sectional view showing a semiconductor device according to an embodiment of the invention.

Now, further, as shown in FIG. 5, by forming a solder-resist layer 36 in the shape of exposing the land 34, a semiconductor device in which at least part of the wiring 32 is covered by the solder-resist layer 36 is also obtained. Furthermore, if necessary, a solder ball (not illustrated) is formed at a portion of the land 34 to produce a semiconductor device making up a projecting electrode for external connection.

According to the embodiment of the invention, by removing the carbonized layer 24 of a spot not overlapping the wiring 32 on the surface of the resin layer 14 through application of O$_2$ plasma, the effect of leakage between one wiring and another is prevented, making it possible to cope with a narrow pitch structure.

A semiconductor device according to the embodiment of the invention is manufactured by a process described above. Its constitution will be described below.

A semiconductor device according to the embodiment has the semiconductor substrate 2 as shown in FIG. 5. The semiconductor substrate 2 has the resin layer 14. On the resin layer 14 is formed a plurality of wiring 32. The carbonized layer 24 exists at a spot not overlapping the wiring 32 on the surface of the resin layer 14. Details are as described in the section on the manufacturing process.

According to the embodiment of the invention, a lack of existence of the carbonized layer 24 of the spot not overlapping the wiring 32 on the surface of the resin layer 14 prevents the effect of leakage between one wiring and another, thus making it possible to cope with the narrow pitch structure.

While the invention is not limited to the embodiment described above, various changes and modifications are possible. For example, the invention includes a constitution which is virtually the same as the constitution described in the embodiment (for example, the constitution having the same function, method, process and effect or the constitution having the same purpose and effect).

Further, the invention includes a constitution which replaced a part that is not intrinsic to the constitution described in the embodiment. Still further, the invention includes a constitution which attains the same operation/working-effect or the same purpose of the constitution described in the embodiment. Furthermore, the invention includes a constitution which consists of a publicly known technique added to the constitution described in the embodiment. Moreover, the invention includes a content which excluded limitedly any of technical matter described in the embodiment. Further, the invention includes a content which excluded limitedly a publicly known technique from the embodiment described above.

What is claimed is:

1. A method of manufacturing a semiconductor device, comprising:

forming a resin layer including a resin containing an aromatic compound on a first surface, of a semiconductor substrate;

forming an opening in the resin layer such that the opening is formed on an electrode that is formed on the first surface of the semiconductor substrate;

making at least part of a surface of the resin layer uneven by O$_2$ plasma after forming the opening such that an oxide film is formed on at least a part of a surface of the electrode;

removing the oxide film from a surface of the electrode using Ar gas and carbonizing the surface of the resin layer to form a carbonized layer;

forming wiring from the electrode to over the carbonized layer; and etching, after forming the wiring, the carbonized layer by O$_2$ plasma using the wiring as a mask so as to remove the carbonized layer partially.

2. A method of manufacturing a semiconductor device, comprising:

forming a resin layer on a first surface of a semiconductor substrate forming an opening in the resin layer such that the opening is formed on an electrode that is formed on the first surface of the semiconductor substrate;

making at least a part of a surface of the resin layer uneven by O₂ plasma after forming the opening such that an oxide film is formed on at least a part of a surface of the electrode;

removing at least a part of the oxide film, at least a part of the resin layer being converted into a carbonized layer during the removing the at least a part of the oxide film;

forming a plurality of wirings such that at least a part of plurality of the wirings is formed on the carbonized layer; and removing at least a part of the carbonized layer by using the plurality of wirings as a mask, the removing the at least a part of the carbonized layer occurring after the formation of the wirings.

3. The method of manufacturing a semiconductor device according to claim 2, wherein the removing the at least a part of the oxide film is performed by using Ar gas.

4. The method of manufacturing a semiconductor device according to claim 2, wherein the removing the at least a part of the carbonized layer is performed by etching at least a part of the carbonized layer with O₂ plasma.

5. The method of manufacturing a semiconductor device according to claim 2, wherein the resin layer includes a resin containing an aromatic compound.

6. The method of manufacturing a semiconductor device according to claim 2, wherein the removing the at least a part of the carbonized layer occurring such that a portion of the carbonized layer disposed between two of the plurality of wirings is removed.

7. The method of manufacturing a semiconductor device according to claim 6, wherein removing the at least a part of the carbonized layer suppresses a leak between the two wirings.

* * * * *